(12) United States Patent
Choi et al.

(10) Patent No.: US 11,397,325 B2
(45) Date of Patent: Jul. 26, 2022

(54) DISPLAY APPARATUS AND HEAD-MOUNTED ELECTRONIC DEVICE INCLUDING THE SAME

(71) Applicant: Samsung Display Co., Ltd., Yongin-si (KR)

(72) Inventors: Chungsock Choi, Yongin-si (KR); Soyoung Lee, Yongin-si (KR); Sunyoung Jung, Yongin-si (KR); Sanghwan Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/823,367

(22) Filed: Nov. 27, 2017

(65) Prior Publication Data

US 2018/0149872 A1 May 31, 2018

(30) Foreign Application Priority Data

Nov. 28, 2016 (KR) .................. 10-2016-0159515

(51) Int. Cl.
*G02B 27/01* (2006.01)
*G02B 5/02* (2006.01)
*H01L 51/50* (2006.01)
*H01L 51/52* (2006.01)

(52) U.S. Cl.
CPC ....... *G02B 27/0172* (2013.01); *G02B 5/0242* (2013.01); *G02B 27/017* (2013.01); *H01L 51/504* (2013.01); *H01L 51/5203* (2013.01); *H01L 51/5268* (2013.01); *H01L 51/5284* (2013.01)

(58) Field of Classification Search
CPC G02B 27/0172; G02B 27/017; G02B 5/0242; H01L 51/504; H01L 51/5203; H01L 51/5268; H01L 51/5284
See application file for complete search history.

(56) References Cited

U.S. PATENT DOCUMENTS

| | | | |
|---|---|---|---|
| 8,198,805 B2 | 6/2012 | Takagi et al. | |
| 8,975,814 B2 | 3/2015 | Takai et al. | |
| 9,048,205 B2 | 6/2015 | Han | |
| 9,627,651 B2 | 4/2017 | Kim et al. | |
| 9,911,943 B2 | 3/2018 | Han | |
| 2007/0114925 A1* | 5/2007 | Cok | H01L 51/5268 313/512 |

(Continued)

FOREIGN PATENT DOCUMENTS

| | | |
|---|---|---|
| CN | 101267700 A | 9/2008 |
| CN | 103390729 A | 11/2013 |

(Continued)

*Primary Examiner* — Stephen G Sherman
(74) *Attorney, Agent, or Firm* — Lewis Roca Rothgerber Christie LLP

(57) ABSTRACT

A display apparatus includes a substrate including a plurality of pixel areas spaced from each other, and a plurality of non-pixel areas respectively located between neighboring pixel areas, a plurality of pixel electrodes respectively located in at least a part of the plurality of pixel areas, and a scattering layer on the plurality of pixel electrodes, and including a plurality of non-scattering areas respectively at a central portion of each of the plurality of pixel areas, and a plurality of scattering areas respectively between neighboring non-scattering areas.

18 Claims, 9 Drawing Sheets

(56) References Cited

U.S. PATENT DOCUMENTS

| | | | |
|---|---|---|---|
| 2015/0187857 A1* | 7/2015 | Negishi | H01L 27/3272 257/40 |
| 2015/0194634 A1* | 7/2015 | Kang | H01L 51/5275 257/40 |
| 2015/0340412 A1* | 11/2015 | Lee | H01L 27/322 257/88 |
| 2016/0049612 A1* | 2/2016 | Kim | H01L 33/12 257/88 |
| 2017/0018741 A1* | 1/2017 | Osawa | H01L 51/5268 |
| 2017/0141167 A1* | 5/2017 | Naganuma | H01L 27/3246 |
| 2017/0373268 A1* | 12/2017 | Takahashi | H01L 51/50 |
| 2018/0061894 A1* | 3/2018 | Kim | H01L 51/5268 |
| 2018/0136468 A1* | 5/2018 | Son | G02B 5/0252 |

FOREIGN PATENT DOCUMENTS

| | | |
|---|---|---|
| CN | 104347817 A | 2/2015 |
| CN | 105470406 A | 4/2016 |
| KR | 2003-0045454 A | 6/2003 |
| KR | 2003-0057206 A | 7/2003 |
| KR | 2003-0069285 A | 8/2003 |
| KR | 10-2007-0027264 A | 3/2007 |
| KR | 10-2013-0045267 A | 5/2013 |

* cited by examiner

DISPLAY APPARATUS AND HEAD-MOUNTED ELECTRONIC DEVICE INCLUDING THE SAME

CROSS-REFERENCE TO RELATED APPLICATION

This application claims priority to, and the benefit of, Korean Patent Application No. 10-2016-0159515, filed on Nov. 28, 2016 in the Korean Intellectual Property Office, the disclosure of which is incorporated herein in its entirety by reference.

BACKGROUND

1. Field

One or more embodiments relate to a display apparatus capable of displaying images and capable of improving a light efficiency of a head-mounted display (HMD), and a head-mounted electronic device including the same.

2. Description of the Related Art

A head-mounted display (HMD) apparatus refers to a display apparatus that is worn on a user's head or eyes, and that displays an image to a user. In recent years, as concern about wearable devices has increased, an HMD apparatus in which a micro display apparatus is mounted on a front side of glasses or of a helmet has been developed. The HMD apparatus may allow a user to perceive a stereoscopic effect, and may realistically realize virtual reality or augmented reality.

In general, to make an HMD, a display apparatus for displaying an image and a lens for enlarging the image to be recognized by a user are used. As a result, a wide viewing angle may be realized with a relatively small-sized display apparatus.

However, in the conventional display apparatus, when an enlarged image is implemented using a lens, a "screen door" effect occurs, and thus an area between neighboring pixels is displayed in black.

SUMMARY

One or more embodiments include a display apparatus capable of displaying high-quality images and capable of improving a light efficiency of a head-mounted display (HMD), and a head-mounted electronic device including the same. However, this is merely an example, and embodiments of the disclosure are not limited thereto.

Additional aspects will be set forth in part in the description that follows and, in part, will be apparent from the description, or may be learned by practice of the presented embodiments.

According to one or more embodiments, a display apparatus includes a substrate including a plurality of pixel areas spaced from each other, and a plurality of non-pixel areas respectively located between neighboring pixel areas, a plurality of pixel electrodes respectively located in at least a part of the plurality of pixel areas, and a scattering layer on the plurality of pixel electrodes, and including a plurality of non-scattering areas respectively at a central portion of each of the plurality of pixel areas, and a plurality of scattering areas respectively between neighboring non-scattering areas.

The display apparatus may further include a plurality of emission layers respectively on the plurality of pixel electrodes, a counter electrode located on the plurality of emission layers, and corresponding to the plurality of pixel electrodes, and an encapsulation layer interposed between the counter electrode and the scattering layer.

The encapsulation layer may include an insulating layer having a stack structure, and a layer of the insulating layer that is closest to the scattering layer may include an inorganic layer.

The inorganic layer may include silicon nitride.

The display apparatus may further include a buffer layer between the encapsulation layer and the scattering layer.

The encapsulation layer includes an insulating layer having a stack structure, and a layer of the insulating layer that is closest to the buffer layer may include an inorganic layer having a refractive index that is greater than a refractive index of the buffer layer.

At least a part of the buffer layer may directly contact the encapsulation layer.

The display apparatus may further include a light-shielding layer between the encapsulation layer and the buffer layer, and defining a plurality of openings that are configured to respectively overlap the plurality of non-scattering areas of the scattering layer.

The light-shielding layer may include a light absorbing material.

The scattering areas may have a higher rate of light scattering than the non-scattering areas.

The scattering layer may include scattering particles that are configured to scatter incident light and that are either not located in the non-scattering areas, or are located in the non-scattering areas at a lower concentration than in the scattering areas.

According to one or more embodiments, a display apparatus includes a substrate including a plurality of pixel areas spaced apart from each other, and a plurality of non-pixel areas respectively located between neighboring pixel areas, a plurality of pixel electrodes respectively located in at least a part of the plurality of pixel areas, a scattering layer on the plurality of pixel electrodes, an encapsulation layer on the plurality of pixel electrodes, and including an insulating layer having a stack structure, and a buffer layer between the encapsulation layer and the scattering layer, wherein a layer of the insulating layer that is closest to the buffer layer includes an inorganic layer having a refractive index that is greater than a refractive index of the buffer layer.

The display apparatus may further include a plurality of emission layers respectively located on the plurality of pixel electrodes, and a counter electrode on the plurality of emission layers, and corresponding to the plurality of pixel electrodes.

The inorganic layer may include silicon nitride.

At least a part of the buffer layer may directly contact the encapsulation layer.

The scattering layer may include a plurality of non-scattering areas respectively located at a central portion of each of the plurality of pixel areas, and a plurality of scattering areas respectively located between neighboring non-scattering areas, and having a higher light scattering rate than the non-scattering areas.

The scattering layer may include scattering particles that are configured to scatter incident light, and that are either not located in the non-scattering areas, or are located in the non-scattering areas at a lower concentration than in the scattering areas.

The display apparatus may further include a light-shielding layer between the encapsulation layer and the buffer layer, and defining a plurality of openings that are configured to respectively overlap the plurality of non-scattering areas of the scattering layer.

The light-shielding layer may include a light absorbing material.

According to one or more embodiments, a head-mounted electronic device includes a display apparatus including a substrate including a plurality of pixel areas spaced from each other, and a plurality of non-pixel areas respectively located between neighboring pixel areas, a plurality of pixel electrodes respectively located in at least a part of the plurality of pixel areas, and a scattering layer on the plurality of pixel electrodes, and including a plurality of non-scattering areas respectively at a central portion of each of the plurality of pixel areas, and a plurality of scattering areas respectively between neighboring non-scattering areas, a lens unit facing the display apparatus, and configured to enlarge an image displayed by the display apparatus, and refract the enlarged image in an eyeball direction of a user, and a frame configured to accommodate the display apparatus and the lens unit, and configured to be worn on a user's head.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
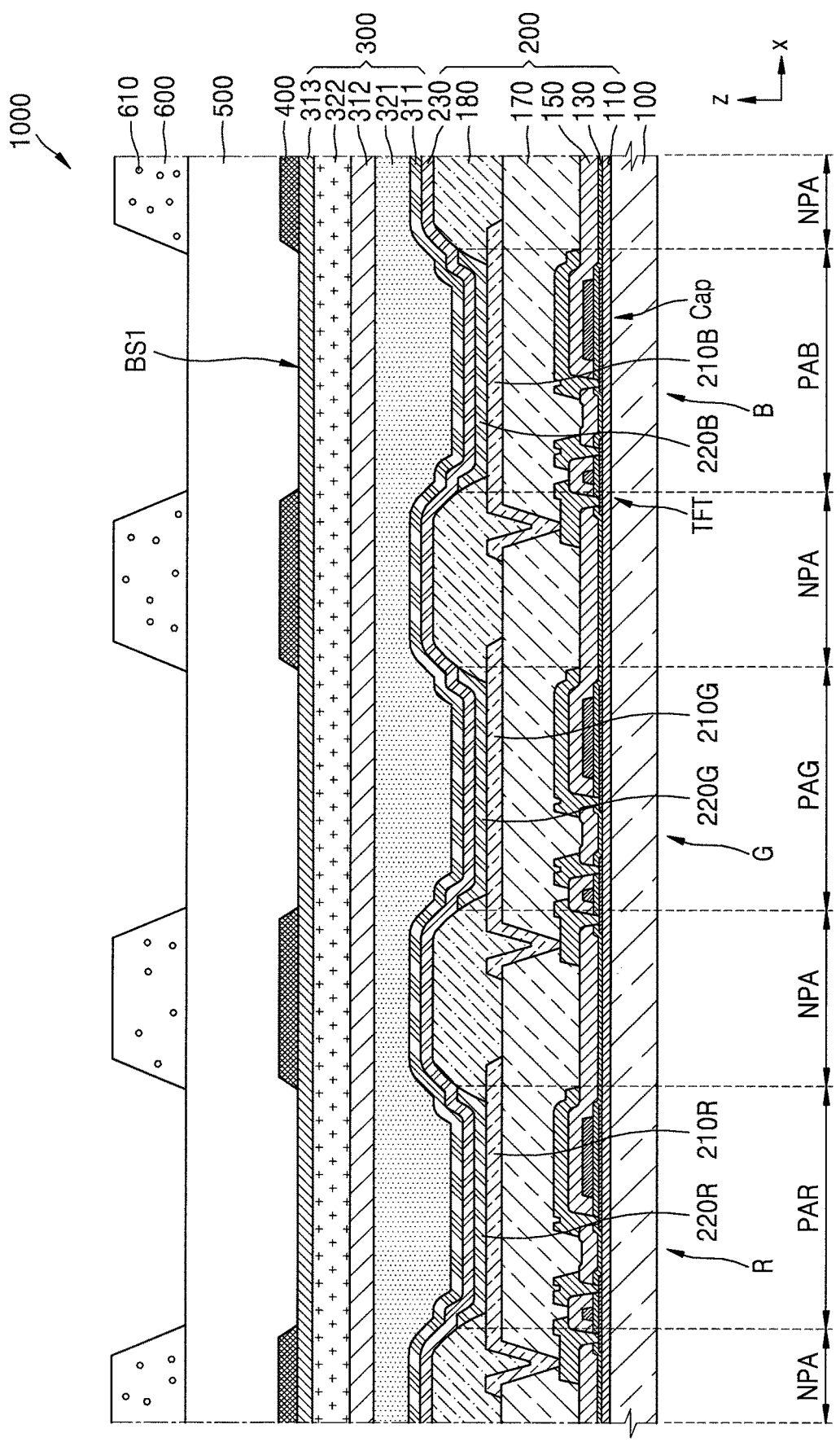
FIG. 1 is a cross-sectional view of a display apparatus according to an embodiment.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a cross-sectional view of a display apparatus 1000 according to an embodiment.

Referring to FIG. 1, the display apparatus 1000 according to an embodiment may include a substrate 100, a plurality of pixel electrodes 210R, 210G, and 210B, and a scattering layer 600.

The substrate 100 may include various materials, such as a glass material, a metal material, or a plastic material, and includes a plurality of pixel areas PAR, PAG, and PAB and a plurality of non-pixel areas NPA. The plurality of pixel areas PAR, PAG, and PAB are spaced apart from each other on the substrate 100, and are areas in which a central portion of a pixel is located. The plurality of non-pixel areas NPA are areas located between the plurality of pixel areas PAR, PAG, and PAB.

The plurality of pixel electrodes 210R, 210G, and 210B are located in the plurality of pixel areas PAR, PAG, and PAB of the substrate 100. The plurality of pixel electrodes 210R, 210G, and 210B may be located in a wider area than the plurality of pixel areas PAR, PAG, and PAB. At least central portions of the plurality of pixel electrodes 210R, 210G, and 210B are located in the plurality of pixel areas PAR, PAG, and PAB, respectively. A pixel defining layer 180 is formed so as to overlap at least a part of each of the plurality of non-pixel areas NPA. The pixel defining layer 180 may have a shape protruding in a +Z-direction from the plurality of pixel electrodes 210R, 210G, and 210B with the substrate 100 as a center.

In addition to the plurality of pixel electrodes 210R, 210G, and 210B, and the pixel defining layer 180, the substrate 100 may further include various components. For example, according to an embodiment, a thin-film transistor TFT or a capacitor Cap may be located on the substrate 100, as shown in FIG. 1. A buffer layer 110 formed to prevent impurities from penetrating into a semiconductor layer of the thin-film transistor TFT, a gate insulating layer 130 for insulating the semiconductor layer of the thin-film transistor TFT from a gate electrode, an interlayer insulating layer 150 for insulating a source electrode/drain electrode of the thin-film transistor TFT from the gate electrode, a planarization layer 170 having a substantially flat top surface covering the thin-film transistor TFT, and other components may be provided.

The plurality of pixel electrodes 210R, 210G, and 210B may be semi-transparent electrodes or reflective electrodes. When the plurality of pixel electrodes 210R, 210G and 210B are semi-transparent electrodes, each of the plurality of pixel electrodes 210R, 210G and 210B may include indium tin oxide (ITO), indium zinc oxide (IZO), zinc oxide (ZnO), indium oxide ($In_2O_3$), indium gallium oxide (IGO), and/or aluminum zinc oxide (AZO). When the plurality of pixel electrodes 210R, 210G, and 210B are reflective electrodes, each of the plurality of pixel electrodes 210R, 210G and 210B may include a reflective layer including silver (Ag), magnesium (Mg), aluminum (Al), platinum (Pt), palladium (Pd), gold (Au), nickel (Ni), neodymium (Nd), iridium (Ir), chromium (Cr), and/or a compound thereof, and a film formed of ITO, IZO, ZnO, and/or $In_2O_3$. However, configurations and materials of the plurality of pixel electrodes 210R, 210G, and 210B are not limited thereto, and various modifications are possible.

The pixel defining layer 180 may have openings defining pixels R, G, and B (e.g., an opening exposing a central portion of, or all of, each of the plurality of pixel electrodes 210R, 210G, and 210B). In addition, the pixel defining layer 180 may prevent an electrical arc from being generated at ends of the pixel electrodes 210R, 210G, and 210B by increasing a distance between the end of each of the plurality of pixel electrodes 210R, 210G, and 210B and a counter electrode 230.

Intermediate layers 220R, 220G, and 220B are respectively located on the plurality of pixel electrodes 210R, 210G, and 210B. Each of the intermediate layers 220R, 220G and 220B may have a multilayer structure including an emission layer. In such an embodiment, unlike FIG. 1, each of the intermediate layers 220R, 220G, and 220B may have a structure in which some layers are a common layer approximately corresponding to the entire surface of the substrate 100, and in which other layers may be a pattern layer patterned corresponding to the plurality of pixel electrodes 210R, 210G, and 210B. The intermediate layers 220R, 220G, and 220B may be formed of a low molecular weight material or a high molecular weight material, and may include a hole injection layer, a hole transport layer, an emission layer, an electron transport layer, and/or an electron injection layer. Various methods, such as a vapor deposition method, a spin coating method, an inkjet printing method, and/or a laser thermal transfer method, may be used.

The counter electrode 230 is located on the intermediate layers 220R, 220G, and 220B. The counter electrode 230 may be a semi-transparent electrode or a reflective electrode. When the counter electrode 230 is a semi-transparent electrode, the counter electrode 230 may include a layer including a metal having a small work function, for example, Li, Ca, lithium fluoride (LiF)/Ca, LiF/Al, Al, Ag, Mg, or a compound thereof, and a semi-transparent conductive layer such as ITO, IZO, ZnO, and/or $In_2O_3$. When the counter electrode 230 is a reflective electrode, the counter electrode 230 may include a layer including Li, Ca, LiF/Ca, LiF/Al, Al, Ag, Mg, and/or a compound thereof. However, structures and materials of the counter electrode 230 are not limited thereto and may vary.

As a result, an organic light-emitting diode (OLED) including the plurality of pixel electrodes 210R, 210G, and 210B, the counter electrode 230 corresponding to the plurality of pixel electrodes 210R, 210G, and 210B, and the intermediate layers 220R, 220G, and 220B respectively interposed between the plurality of pixel electrodes 210R, 210G, and 210B and the counter electrode 230 may be used in a display device, a liquid crystal display device, or the like. Hereinafter, for convenience of explanation, a display apparatus according to an embodiment will be considered to be an organic light-emitting display apparatus.

An encapsulation layer 300 is located on the counter electrode 230. The encapsulation layer 300 protects display elements including the pixel electrodes 210R, 210G, and 210B, the intermediate layers 220R, 220G, and 220B, and the counter electrode 230 from impurities, such as external oxygen and moisture.

The encapsulation layer 300 may include at least one inorganic layer and at least one organic layer. The encapsulation layer 300 may have a structure in which at least one inorganic layer and at least one organic layer are alternately and repeatedly stacked. In an embodiment, the encapsulation layer 300 may include a first inorganic layer 311, a second inorganic layer 312, and a third inorganic layer 313 in accordance with a stacking order. Furthermore, a first organic layer 321 may be interposed between the first inorganic layer 311 and the second inorganic layer 312, and a second organic layer 322 may be interposed between the second inorganic layer 312 and the third inorganic layer 313. However, a structure of the encapsulation layer 300 is not limited thereto, and a stacking order of inorganic layers and organic layers, as well as the number of inorganic layers and the number of organic layers, may also be appropriately modified depending on the design.

The organic layers 321 and 322 of the encapsulation layer 300 may include a polymer, and may be a single layer or a stacked layer including any one of polyethylene terephthalate, polyimide, polycarbonate, epoxy, polyethylene, and/or polyacrylate. The inorganic films 311, 312, and 313 of the encapsulation layer 300 may be a single layer or a stacked layer including a metal oxide, a metal nitride, a metal oxynitride, and/or the like. The uppermost layer of the encapsulation layer 300 may include an inorganic layer to effectively prevent moisture, oxygen, and the like from permeating into the device. For example, the uppermost layer of the encapsulation layer 300 of FIG. 1 may include silicon nitride or the like.

A light-shielding layer 400 is located on the encapsulation layer 300. The light-shielding layer 400 has a plurality of openings respectively located at a central portion or an entirety of each of the plurality of pixel areas PAR, PAG and PAB, and areas between the plurality of openings are filled with a light absorbing material or the like. Accordingly, the light blocking layer 400 prevents some of light emitted from one of the plurality of pixel areas PAR, PAG and PAB from traveling to an adjacent pixel area, thereby preventing color mixing and also preventing a blurring phenomenon. When the blurring phenomenon occurs, images are blurred as emitted light of adjacent pixel areas emitting identical color light is affected.

A light absorbing material for forming the light-shielding layer 400 may include an organic material including a black pigment. However, the light-shielding layer 400 does not necessarily include a light absorbing material, but may include a metal such as chromium, chromium oxide, or a metal oxide to reflect light. When the light-shielding layer 400 includes a metal or a metal oxide, the light-shielding layer 400 may be formed in a form of a single layer or a stacked layer by sputtering or E-beam evaporation.

A buffer layer 500 is located on the light-shielding layer 400. In an embodiment, an interlayer may not be located between the buffer layer 500 and the light-shielding layer 400, and thus the buffer layer 500 may be in direct contact with the third inorganic layer 313, which is the uppermost layer of the encapsulation layer 300, through a plurality of openings formed in the light-shielding layer 400.

The buffer layer 500 is located between the light-shielding layer 400 and the scattering layer 600, and provides a free space for light passing through one pixel area of the light-shielding layer 400 to travel to adjacent pixel areas PAR, PAG, and PAB and/or to adjacent non-pixel areas NPA of the scattering layer 600. The buffer layer 500 may include a transparent material to allow light to pass therethrough, and may have a suitable thickness so that light travels obliquely toward the scattering layer 600 in the light-shielding layer 400.

In an embodiment, the buffer layer 500 may be a planarization layer for flattening irregularities of the light-shielding layer 400 so that the scattering layer 600 may be easily located on the light-shielding layer 400 having a plurality of openings. Accordingly, the buffer layer 500 may be an organic layer including a transparent material. In another embodiment, the buffer layer 500 may serve as an adhesive layer so that the scattering layer 600 may be firmly attached to or coupled to the light-shielding layer 400. In this case, the buffer layer 500 may include a pressure-sensitive adhesive (PSA), an optical-clear adhesive (OCA), or the like.

Furthermore, the buffer layer 500 may have a refractive index that is less than that of the third inorganic layer 313, which is the uppermost layer of the encapsulation layer 300. Detailed descriptions thereof will be given with reference to FIGS. 2 and 3.

A scattering layer 600 is located on the buffer layer 500. The scattering layer 600 includes a plurality of scattering particles 610. When the light incident on the scattering layer 600 is visible light, the scattering particles 610 may have a diameter of 100 nm or more. This is because when a diameter of the scattering particles 610 is less than 100 nm, light may not be suitably scattered, so that light is totally reflected and a light efficiency is lowered. Furthermore, if a size of the scattering particles 610 is too large, it is difficult to disperse the scattering particles 610 in the scattering layer 600. Therefore, a size of the scattering particles 610 should be adjusted to be not too large in consideration of a thickness of the scattering layer 600.

The scattering particles 610 may include any one of $TiO_2$, $ZrO_2$, $CeO_2$, and/or $TaO_2$. Here, a refractive index of the scattering particles 610 may be about 1.5 to about 3.0. When the refractive index of the scattering particles 610 is less than about 1.5, it may be difficult to improve a light efficiency. When the refractive index of the scattering particles 610 is greater than about 3.0, the scattering particles 610 become opaque, and a light efficiency may be lowered.

Light that is obliquely incident on adjacent pixel areas and/or adjacent non-pixel areas NPA of the scattering layer 600 through the buffer layer 500 by using the scattering layer 600 may be scattered by the scattering particles 610. Therefore, as light is emitted even from the non-pixel areas NPA, a "screen door" effect that the non-pixel areas NPA are displayed in black may be improved, and the overall light efficiency may also be improved.

In an embodiment, the scattering layer 600 may include a plurality of non-scattering areas respectively located at a central portion of each of the plurality of pixel areas PAR, PAG, and PAB to correspond to the light-shielding layer 400, and a plurality of scattering areas located between neighboring non-scattering areas from among the non-scattering areas. The non-scattering area is an area where a scattering rate of light is relatively low in the scattering layer 600, and the scattering area is an area where a scattering rate of light is relatively high in the scattering layer 600. The plurality of non-scattering areas of the scattering layer 600 may overlap the plurality of openings of the light-shielding layer 400 described above. As a result, there is neither an interlayer, such as the light-shielding layer 400, nor any other inclusion, such as the scattering particles 610, in a path of front light that is emitted from the plurality of pixel areas PAR, PAG and PAB in a front direction, thereby improving light efficiency of the front light.

In an embodiment, the scattering layer 600 may be formed by forming the above-described non-scattering areas in the form of an opening. In more detail, the scattering layer 600 may form a strip shape having one or more openings respectively corresponding to the plurality of non-scattering areas by coating a scattering layer forming material on the buffer layer 500 in the form of a strip. Alternatively, the scattering layer 600 may be formed by applying the scattering layer forming material on the entire upper surface of the buffer layer 500, and then patterning a portion corresponding to the plurality of non-scattering areas.

Figure 2:
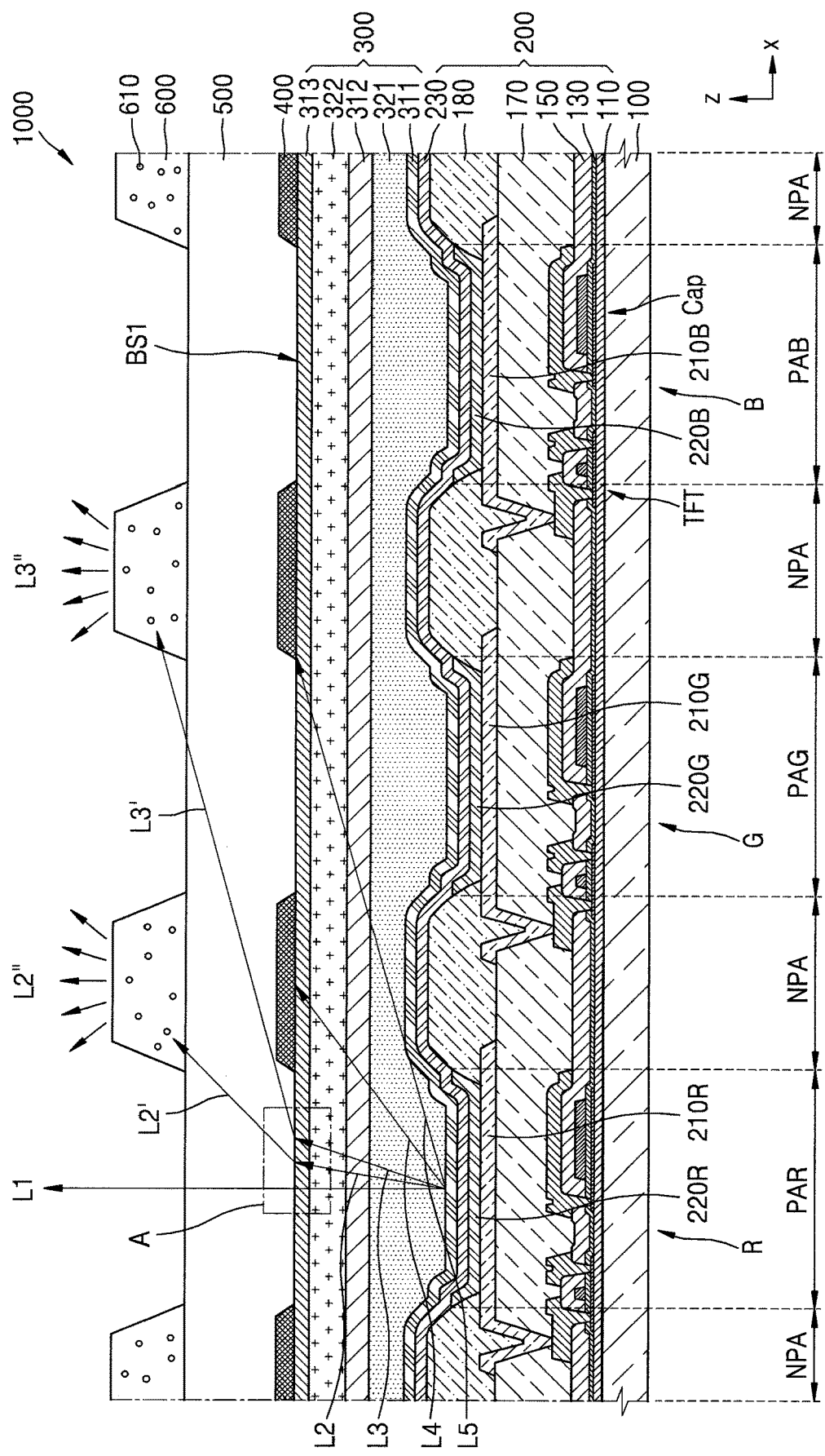
FIG. 2 is a view of an optical path in one pixel of the display apparatus of FIG. 1 according to an embodiment.
Figure 3:
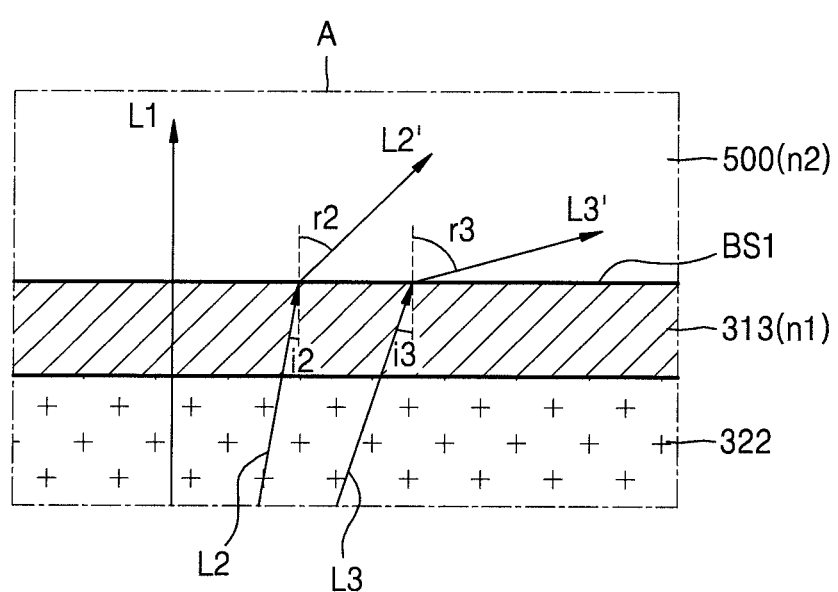
FIG. 3 is an enlarged view of portion A of FIG. 2 according to an embodiment.

FIG. 2 is a view of an optical path in one pixel of the display apparatus 1000 of FIG. 1 according to an embodiment, and FIG. 3 is an enlarged view of portion A of FIG. 2 according to an embodiment.

Referring to FIGS. 2 and 3, the plurality of pixel areas PAR, PAG, and PAB may include a red pixel area PAR, a green pixel area PAG, and a blue pixel area PAB. In addition, the non-pixel area NPA is located between the red pixel area PAR and the green pixel area PAG, and is located between the green pixel area PAG and the blue pixel area PAB, respectively. There are various ways of distinguishing a pixel area and a non-pixel area. For convenience of explanation, an area in which the intermediate layers 220R, 220G, and 220B corresponding to an area from which light is emitted is defined as a pixel area, and an area between neighboring intermediate layers from among the intermediate layers 220R, 220G, and 220B is defined as the non-pixel area NPA.

For example, when red light is emitted, first light L1, which is front light, and side lights L2, L3, L4, and L5 may be emitted from a red intermediate layer 220R of the red pixel area PAR. Here, the first light L1 is incident to be substantially perpendicular with respect to the buffer layer 500 through an opening of the light-shielding layer 400 and through the encapsulation layer 300, and then travels to an upper portion of the display apparatus 1000 through the non-scattering areas of the scattering layer 600 while maintaining a traveling direction of the first light L1. Here, the openings of the light-shielding layer 400 and the non-scattering areas of the scattering layer 600 are respectively located approximately immediately above the pixel areas PAR, PAG, and PAB of the substrate 100 as described above.

On the other hand, the side lights L2, L3, L4 and L5 are obliquely incident on the buffer layer 500 through the encapsulation layer 300 and then refract in a direction that is different from the initial direction of the side lights L2, L3, L4 and L5, which are incident on the buffer layer 500, due to a difference in a refractive index between the buffer layer 500 and the encapsulation layer 300.

In more detail, when the side lights L2, L3, L4, and L5 are referred to as a second light L2, a third light L3, a fourth light L4, and a fifth light, then the second light L2 and the third light L3 passing through the opening of the light-shielding layer 400 are refracted at a boundary surface BS1 of the encapsulation layer 300 and the buffer layer 500 to respectively form a second refracted light L2' and a third refracted light L3'. The second refracted light L2' is incident on a portion of the scattering layer 600 located in a non-pixel area between the red pixel area PAR and the green pixel area PAG from among adjacent non-pixel areas NPA, and is scattered in the form of second scattered light L2". Likewise, the third refracted light L3' is also incident on a portion of the scattering layer 600 located in a non-pixel area between the green pixel area PAG and the blue pixel area PAB from among adjacent non-pixel areas NPA, and is scattered in the form of third scattered light L3". On the other hand, the fourth light L4 and fifth light L5, which pass through a portion that is not the opening of the light-shielding layer 400, are absorbed or reflected by the light-shielding layer 400, and may not travel toward the buffer layer 500.

Therefore, in the display apparatus 1000 according to an embodiment, the first light L1 that is front light passing through a plurality of openings of the light-shielding layer 400 is emitted without being scattered, and a light efficiency in a front direction may be improved. In addition, the second light L2 and the third light L3, which are side lights passing through the plurality of openings of the light-shielding layer 400, are emitted through the adjacent non-pixel areas NPA of the scattering layer 600 and are scattered, thereby reducing a screen door effect. Furthermore, the fourth light L4 and the fifth light L5, which are side lights incident on a portion which is not the openings of the light-shielding layer 400, are absorbed or reflected by the light-shielding layer 400 to be not emitted and to prevent color mixing with emitted light of adjacent pixel areas, image blurring, or the like.

Meanwhile, for the second light L2 and the third light L3 passing through the plurality of openings of the light-shielding layer 400 to smoothly spread to the adjacent non-pixel areas NPA of the scattering layer 600, the second light L2 and the third light L3 may be suitably refracted at a relatively large angle at the boundary surface BS1 between the third inorganic layer 313 and the buffer layer 500, as shown in FIG. 3.

$$\frac{\sin r}{\sin i} = \frac{n1}{n2} \qquad \text{Equation 1}$$

Wherein i is an incident angle of light, r is a refraction angle of light, n1 is a refractive index of a medium on which the light is incident, and n2 is a refractive index of a medium from which light is emitted.

According to Equation 1, to increase the refraction angle r of light, n2, which is the refractive index of the medium from which light is emitted, should be less than n1, which is the refractive index of the medium on which the light is incident. Therefore, when an incident angle of the second light L2 and an incident angle of the third light L3 are respectively a second incident angle i2 and a third incident angle i3, as shown in FIG. 3, in order for a second refraction angle r2 and a third refraction angle r3 to be larger than a second incident angle i2 and a third incident angle i3, a refractive index n2 of the buffer layer 500 should be less than a refractive index n1 of the third inorganic layer 313, which is a medium on which light incident. For example, the third inorganic layer 313 may include silicon nitride having a relatively high refractive index.

Figure 4:
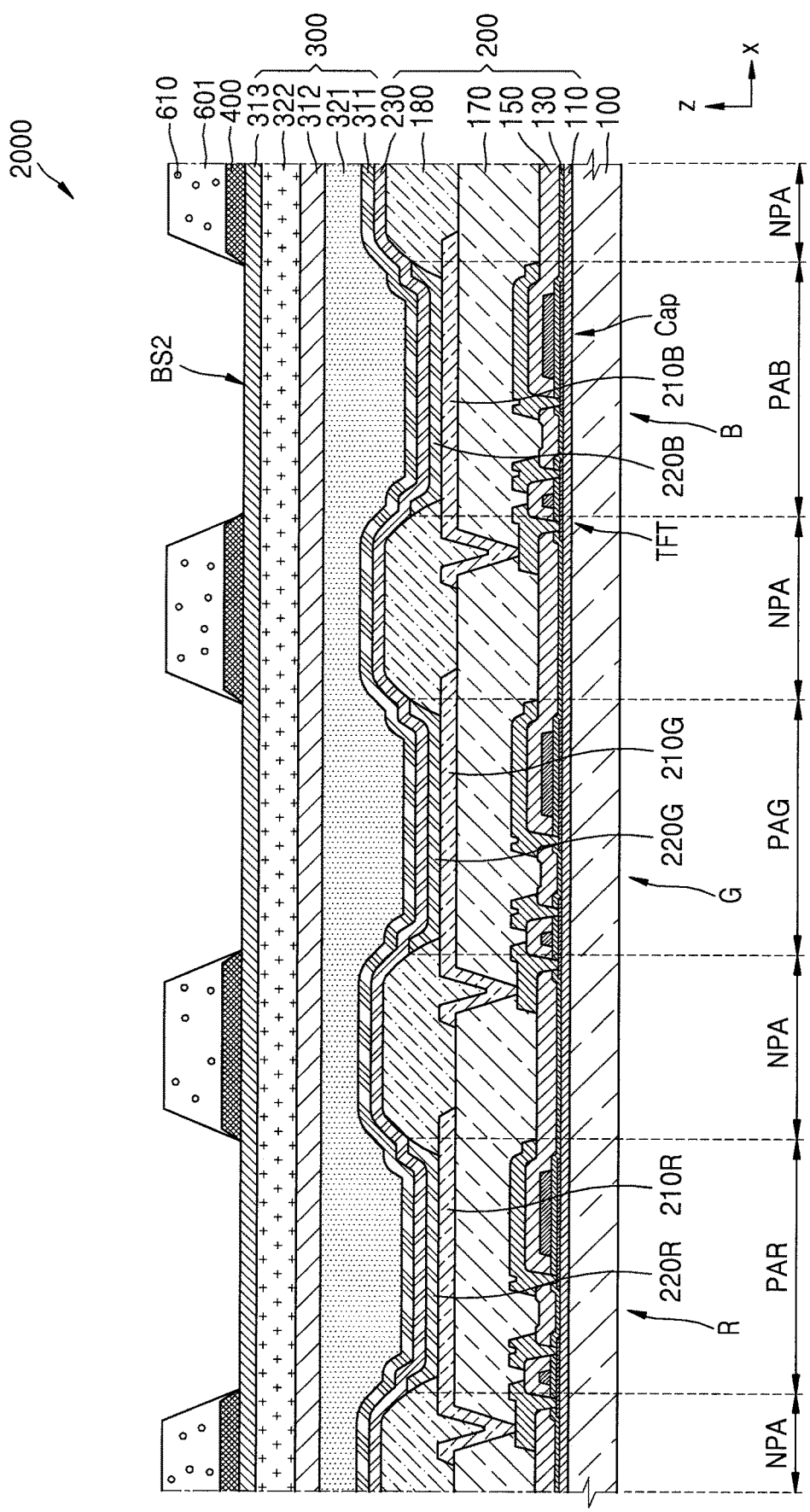
FIG. 4 is a cross-sectional view of a display apparatus according to another embodiment.
Figure 5A:
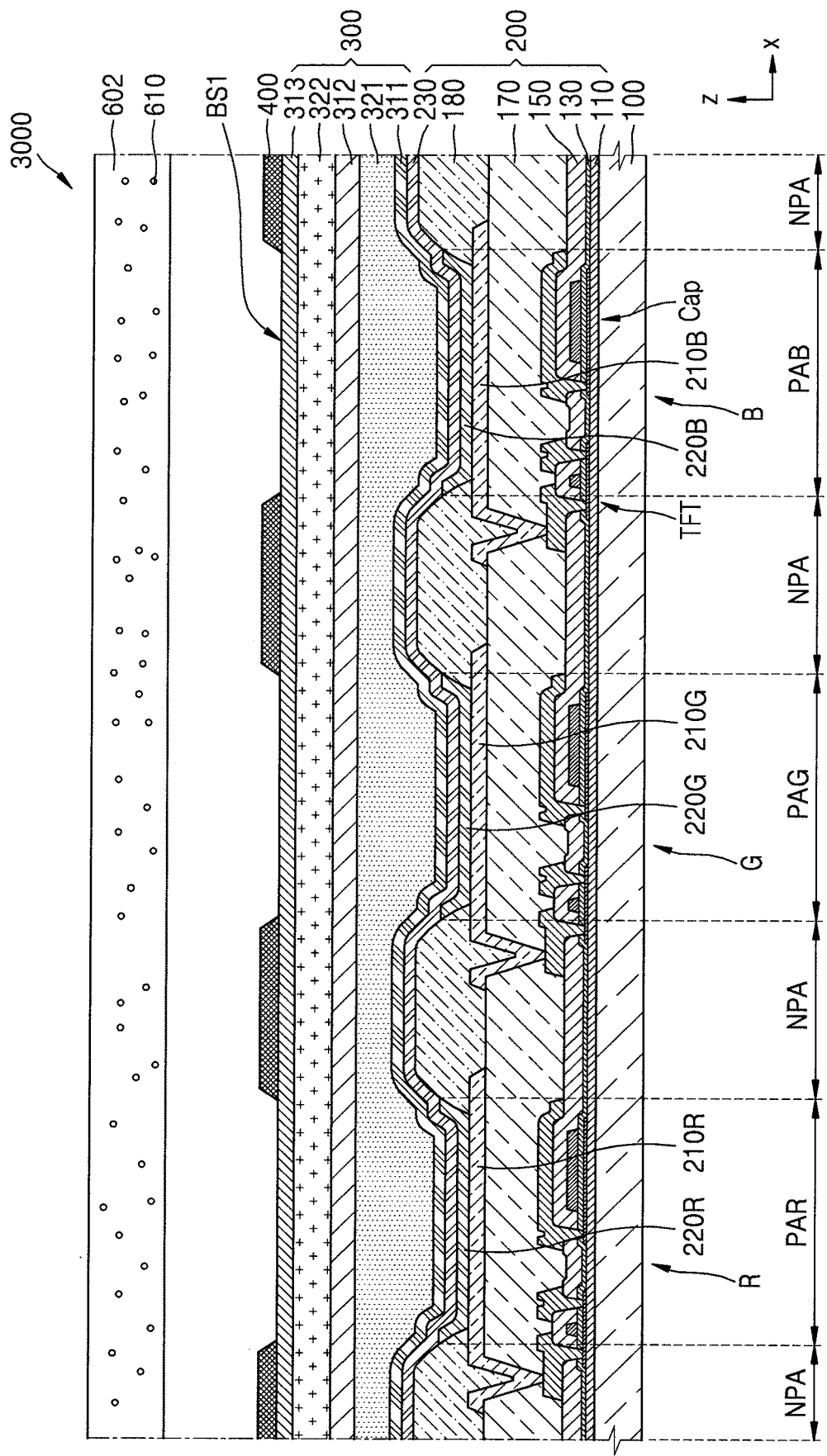
FIGS. 5A through 5C are cross-sectional views of display apparatuses according to another embodiment and its variations.
Figure 5B:
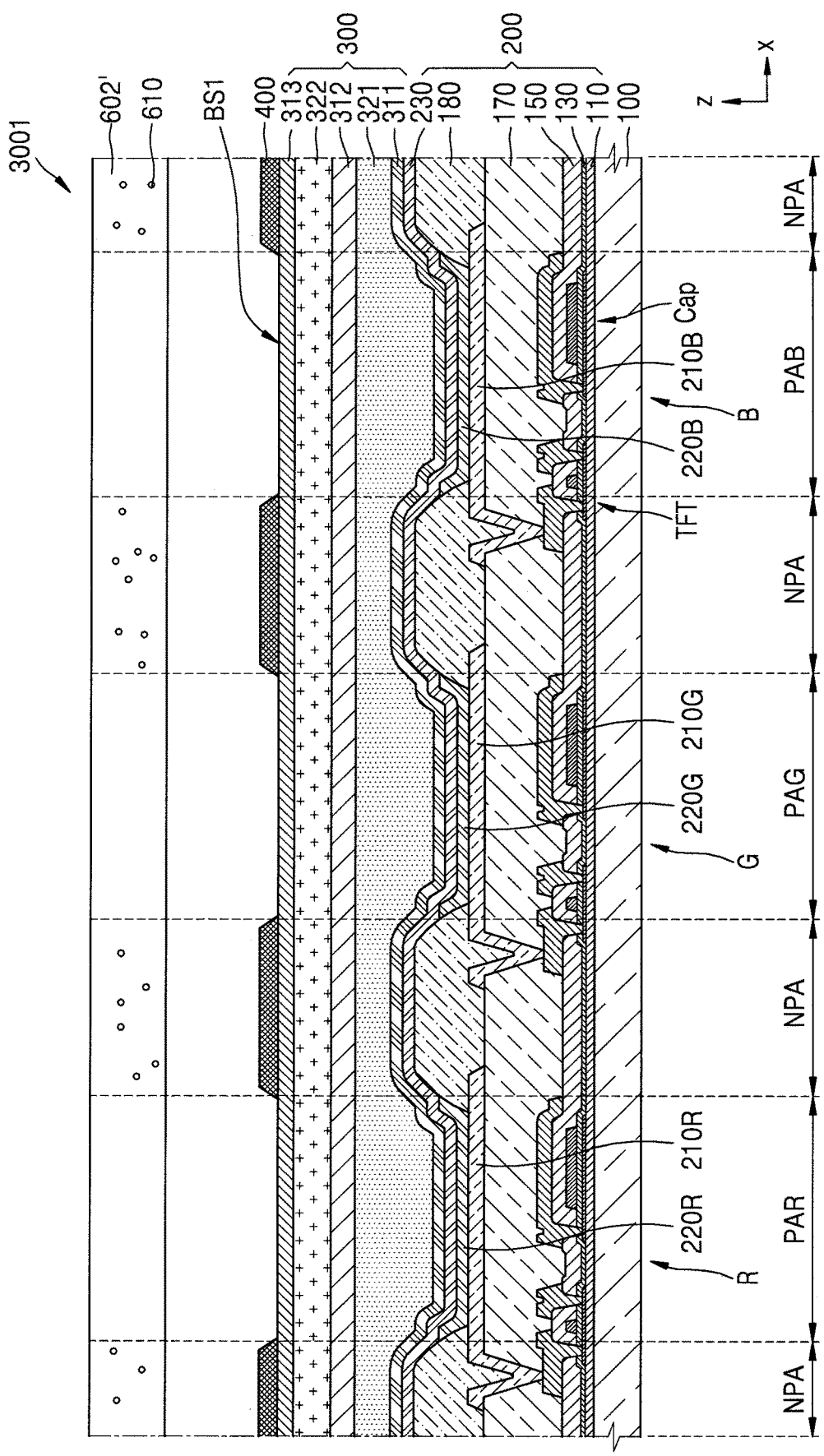
Figure 5C:
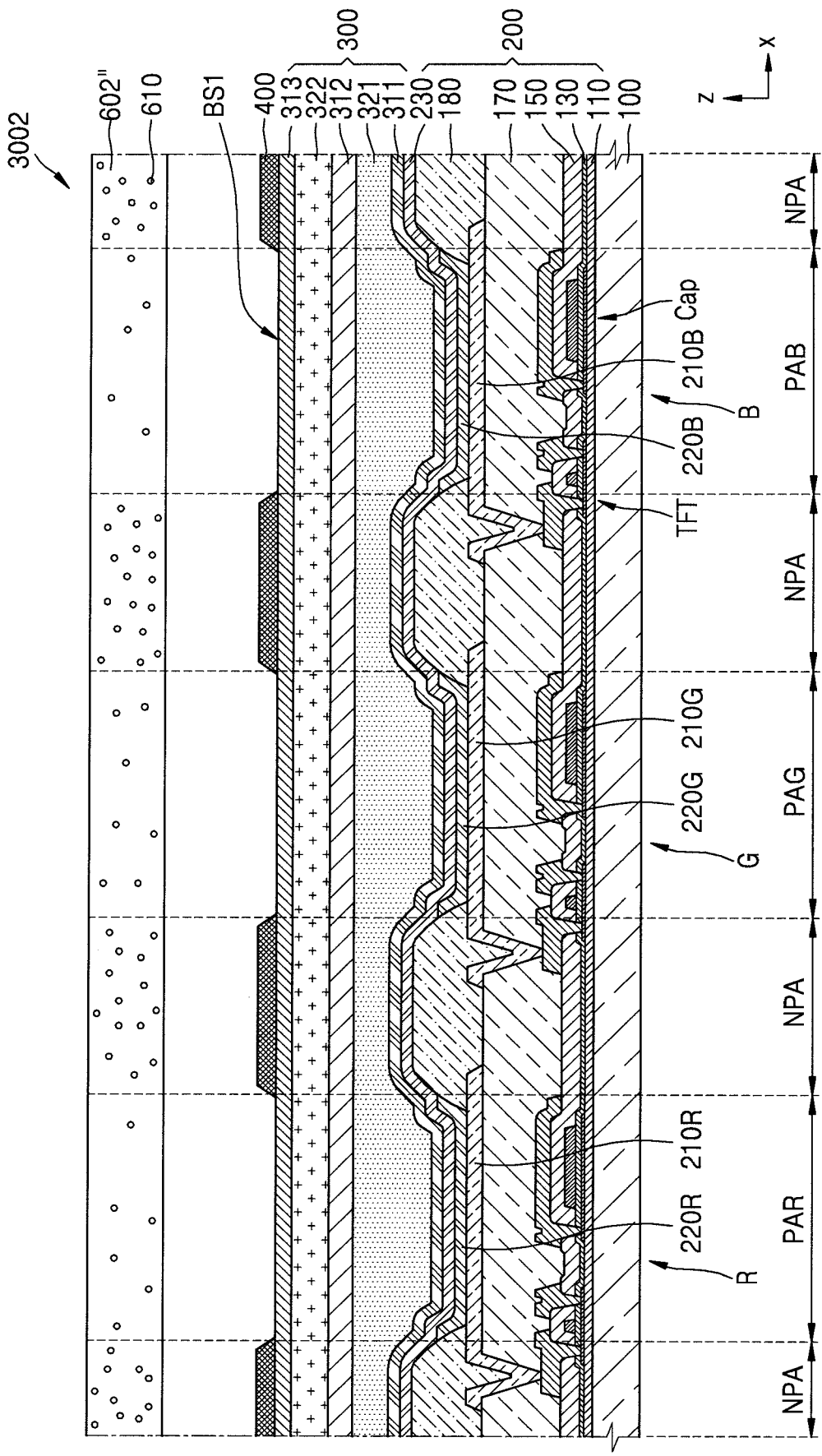
Figure 6:
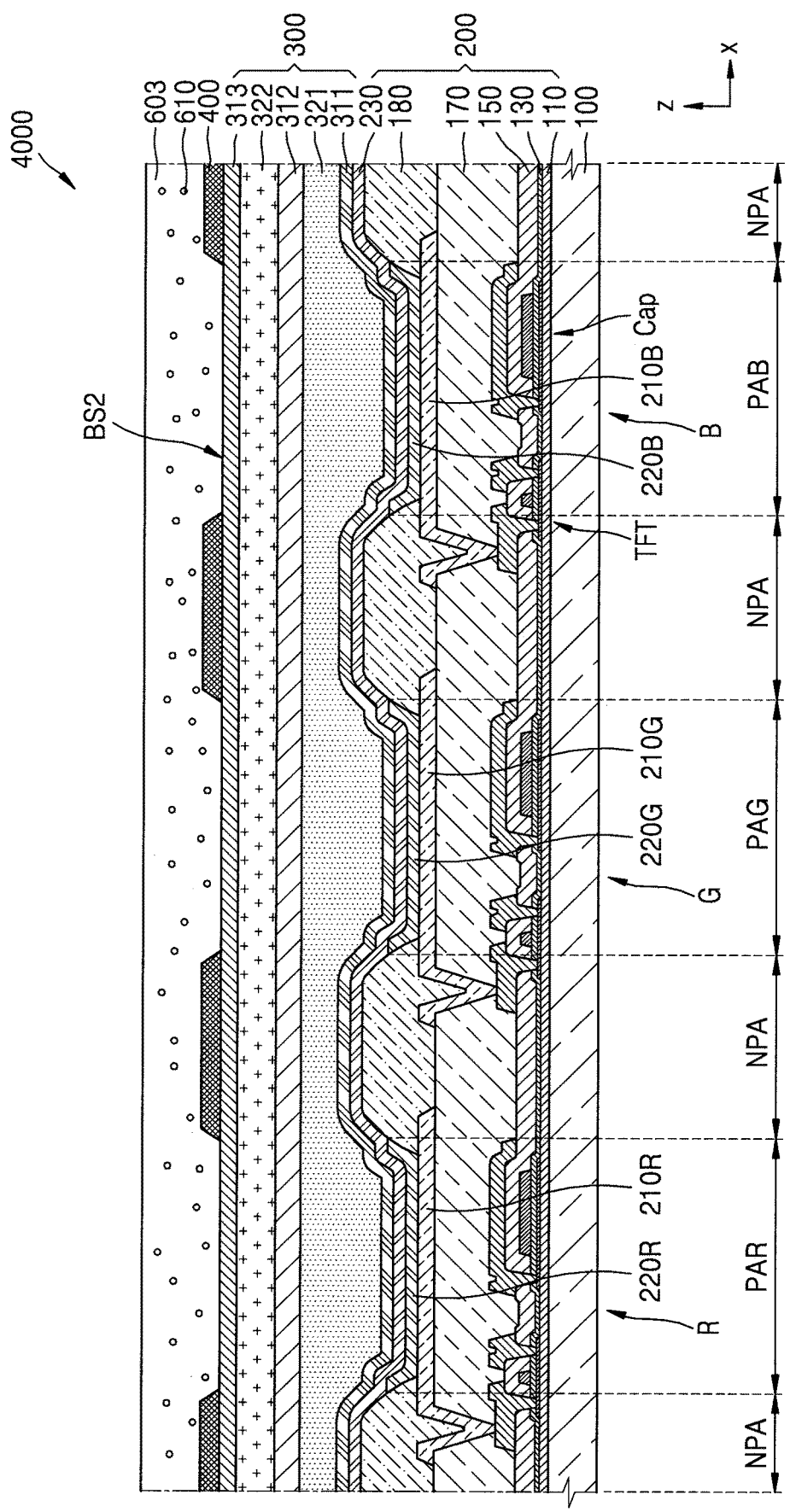
FIG. 6 is a cross-sectional view of a display apparatus according to another embodiment.

FIG. 4 is a cross-sectional view of a display apparatus 2000 according to another embodiment, FIGS. 5A through 5C are cross-sectional views of display apparatuses 3000, 3001, and 3002 according to another embodiment and its variations, and FIG. 6 is a cross-sectional view of a display apparatus 4000 according to another embodiment.

Referring to FIG. 4, the display apparatus 2000 according to the embodiment of FIG. 4 is different from the display apparatus 1000 according to the embodiments of FIGS. 1 and 2 in that a buffer layer is omitted, and in that the scattering layer 601 is located directly on the light-shielding layer 400. For example, the scattering layer 601 may be formed by coating a transparent adhesive including the plurality of scattering particles 610 on the light-shielding layer 400 in a film form, or by applying the transparent adhesive on the entire surface of the light-shielding layer 400 and then patterning the same. The display apparatus 2000 of the present embodiment may be applied to a case where a size of the plurality of pixel areas PAR, PAG, and PAB is small and where a thickness of the encapsulation layer 300 is relatively large. That is, because the plurality of pixel areas PAR, PAG, and PAB are formed to be relatively dense, light may easily reach adjacent pixel areas PAR, PAG, and PAB and/or adjacent non-pixel areas NPA. Because the encapsulation layer 300 provides a free space for light diffusion, an interlayer such as a buffer layer may be omitted.

Referring to FIGS. 5A through 5C, the display apparatuses 3000, 3001, and 3002 of FIGS. 5A through 5C may be different from the display apparatus 1000 according to the embodiments of FIGS. 1 and 2 in that scattering layers 602, 602', and 602" are located over the plurality of pixel areas PAR, PAG, and PAB and the plurality of non-pixel areas NPA. For example, the scattering layers 602, 602', and 602" may be formed by coating a transparent film including the plurality of scattering particles 610 on the buffer layer 500.

The display apparatus 3000 according to the embodiment of FIG. 5A includes the scattering particles 610 in the plurality of pixel areas PAR, PAG, and PAB as well as in the plurality of non-pixel areas NPA. Therefore, according to the present embodiment, a light efficiency in a front direction may be somewhat lowered. However, if a thickness of the buffer layer 500 is appropriately controlled, and if a difference between a refractive index of the buffer layer 500 and a refractive index of the third inorganic layer 313 is appropriately controlled, light may further travel to adjacent pixel areas PAR, PAG, and PAB and/or adjacent non-pixel areas NPA, thereby improving the overall light efficiency.

The display apparatus 3001 according to the embodiment of FIG. 5B is a variation of the display apparatus 3000 according to the embodiment of FIG. 5A. That is, the scattering layer 602' of the present embodiment is divided into a portion including the scattering particles 610 and a portion not including the scattering particles 610. The portion of the scattering layer 602' including the scattering particles 610 indicates scattering areas corresponding to the non-pixel areas NPA of the substrate 100, and the portion of the scattering layer 602' not including the scattering particles 610 indicates non-scattering areas corresponding to the pixel areas PAR, PAG, and PAB of the substrate 100. Thus, the scattering areas of the scattering layer 602' may have a higher light scattering rate than the non-scattering areas of the scattering layer 602'.

The display apparatus 3002 according to the embodiment of FIG. 5C is also a variation of the embodiment of FIG. 5A, but is different from the display apparatus 3001 according to the embodiment of FIG. 5B in that non-scattering areas (e.g., areas that are between scattering areas) also include the scattering particles 610. In more detail, the scattering layer 602" of the present embodiment is divided into a portion including relatively more scattering particles 610, and a portion including relatively fewer scattering particles 610. The portion of the scattering layer 602" including relatively more scattering particles 610 means scattering areas, and the portion of the scattering layer 602" including relatively fewer scattering particles 610 means non-scattering areas. Here, the scattering areas mean areas corresponding to the non-pixel areas NPA of the substrate 100 in the scattering layer 602", and the non-scattering areas mean areas corresponding to the pixel areas PAR, PAG, and PAB of the substrate 100 in the scattering layer 602". Thus, the scattering areas of the scattering layer 602" may have a higher light scattering rate than the non-scattering areas of the scattering layer 602".

Therefore, to form the scattering layers 602' and 602" as shown in FIGS. 5B and 5C, respectively, the number of the scattering particles 610 present in each of the scattering areas and the non-scattering areas of the scattering layers 602' and 602" may be varied. Also, the number of the scattering particles 610 may be appropriately varied depending on a suitable light efficiency in the scattering areas or in the non-scattering areas.

Referring to FIG. 6, the display apparatus 4000 according to an embodiment of FIG. 6 may be different from the display apparatus 1000 according to the embodiments of FIGS. 1 and 2 in that the buffer layer is omitted and in that the scattering layer 603 is located over the plurality of pixel areas PAR, PAG, and PAB and the plurality of non-pixel areas NPA. For example, the scattering layer 603 may be formed by coating a transparent adhesive including the plurality of scattering particles 610 on the light-shielding layer 400 in a film form, or by applying the transparent adhesive on the entire surface of the light-shielding layer 400 and then patterning the same. The display apparatus 4000 of the present embodiment may be applied to a case where a size of the plurality of pixel areas PAR, PAG, and PAB is small, and where a thickness of the encapsulation layer 300 is relatively large. Although a light efficiency in a front direction is somewhat reduced, the overall light efficiency may be improved by inducing light to travel further to adjacent pixel areas PAR, PAG, and PAB and/or adjacent non-pixel areas NPA.

Meanwhile, the embodiment of FIG. 6 may also be similar to the embodiments of FIGS. 5B and 5C described above in that the number of scattering particles 610 in the scattering areas and the number of scattering particles 610 in the non-scattering areas may be adjusted to be different from each other in the scattering layer 603.

Figure 7:
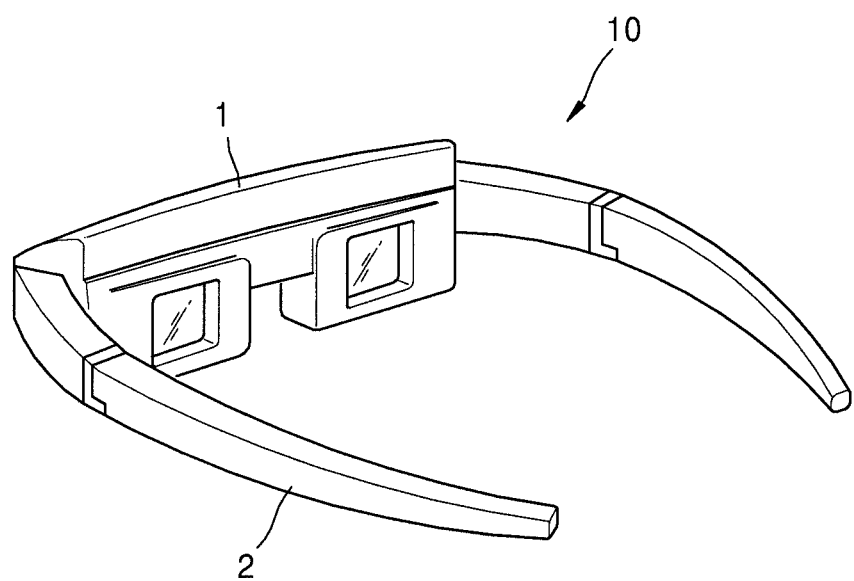
FIG. 7 is a perspective view of a head-mounted electronic device according to an embodiment.

FIG. 7 is a perspective view of a head-mounted electronic device 10 according to an embodiment.

Referring to FIG. 7, the head-mounted electronic device 10 according to an embodiment may include a front frame 1 including a display apparatus as described above with reference to FIGS. 1 through 6, and a side frame 2 (e.g., bows or arms of glasses) located on both sides of the front frame 1 that can be mounted on a user's head. Here, the head-mounted electronic device 10 refers to a device that can be mounted on a user's body and that can display an image. In addition, if the device allows a user to observe an image displayed on the device at a short distance, the device may be referred to as the head-mounted electronic device of an embodiment of the inventive concept irrespective of a general name or a shape of the apparatus. For example, smart glasses, helmet-mounted display devices, computer-mediated reality devices, mixed reality devices, head-up display devices, ultra-slim near-eye display (NED) devices, or wearable display devices may also be included in the inventive concept despite their name.

According to the embodiment as described above, a display apparatus capable of displaying high-quality images by improving a screen door effect, image blurring, or the like, and capable of improving a light efficiency, and a head-mounted electronic device including the display apparatus may be implemented.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims and their functional equivalents.

What is claimed is:

1. A display apparatus comprising:
a substrate comprising a plurality of pixel areas spaced from each other and a plurality of non-pixel areas respectively located between neighboring ones of the pixel areas;
a plurality of pixel electrodes each having a center that is respectively located in at least a part of the plurality of pixel areas;
a pixel defining layer overlapping at least a part of the plurality of non-pixel areas;
a plurality of emission layers being individually arranged on respective ones of the plurality of pixel electrodes;
an encapsulation layer above the plurality of emission layers and the pixel electrodes with respect to the substrate;
a scattering layer above the encapsulation layer with respect to the substrate, the scattering layer having:
a plurality of non-scattering areas respectively at a central portion of each of the plurality of pixel areas; and
a plurality of scattering areas respectively between neighboring ones of the non-scattering areas; and
a light-shielding layer between the encapsulation layer and the scattering layer, the light-shielding layer defining a plurality of openings that respectively overlap the plurality of non-scattering areas of the scattering layer,
wherein the scattering layer comprises a plurality of scattering particles.

2. The display apparatus of claim 1, further comprising:
a counter electrode located on the plurality of emission layers, and corresponding to the plurality of pixel electrodes,
wherein the encapsulation layer is interposed between the counter electrode and the scattering layer.

3. The display apparatus of claim 2, wherein the encapsulation layer comprises an insulating layer having a stack structure, and
wherein a layer of the insulating layer that is closest to the scattering layer comprises an inorganic layer.

4. The display apparatus of claim 3, wherein the inorganic layer comprises silicon nitride.

5. The display apparatus of claim 2, further comprising a buffer layer between the encapsulation layer and the scattering layer.

6. The display apparatus of claim 5, wherein the encapsulation layer comprises an insulating layer having a stack structure, and wherein a layer of the insulating layer that is closest to the buffer layer comprises an inorganic layer having a refractive index that is greater than a refractive index of the buffer layer.

7. The display apparatus of claim 6, wherein at least a part of the buffer layer directly contacts the encapsulation layer.

8. The display apparatus of claim 5, wherein the light-shielding layer is between the encapsulation layer and the buffer layer.

9. The display apparatus of claim 8, wherein the light-shielding layer comprises a light absorbing material.

10. The display apparatus of claim 1, wherein the scattering areas have a higher rate of light scattering than the non-scattering areas.

11. The display apparatus of claim 10, wherein the scattering particles are configured to scatter incident light and are either not located in the non-scattering areas, or are located in the non-scattering areas at a lower concentration than in the scattering areas.

12. A head-mounted electronic device comprising:
the display apparatus of claim 1;
a lens unit facing the display apparatus, and configured to:
  enlarge an image displayed by the display apparatus; and
  refract the enlarged image in an eyeball direction of a user; and
a frame configured to accommodate the display apparatus and the lens unit, and configured to be worn on a user's head.

13. A display apparatus comprising:
a substrate comprising a plurality of pixel areas spaced apart from each other and a plurality of non-pixel areas respectively located between neighboring ones of the pixel areas;
a plurality of pixel electrodes each having a center that is respectively located in at least a part of the plurality of pixel areas;
a plurality of emission layers being individually located on respective ones of the plurality of pixel electrodes;
a pixel defining layer overlapping at least a part of the plurality of non-pixel areas;
an encapsulation layer above the plurality of emission layers and the pixel electrodes with respect to the substrate; and
a scattering layer on the encapsulation layer, the scattering layer having:
  a plurality of non-scattering areas respectively located at a central portion of each of the plurality of pixel areas; and
  a plurality of scattering areas respectively located between neighboring ones of the non-scattering areas, and having a higher rate of light scattering than the non-scattering areas;
a buffer layer between the encapsulation layer and the scattering layer; and
a light-shielding layer between the encapsulation layer and the buffer layer, the light-shielding layer defining a plurality of openings that are configured to respectively overlap the plurality of non-scattering areas of the scattering layer,
wherein the encapsulation layer comprises an insulating layer having a stack structure, and
wherein a layer of the insulating layer that is closest to the buffer layer comprises an inorganic layer having a refractive index that is greater than a refractive index of the buffer layer,
wherein the scattering layer comprises a plurality of scattering particles.

14. The display apparatus of claim 13, further comprising:
a counter electrode on the plurality of emission layers, and corresponding to the plurality of pixel electrodes.

15. The display apparatus of claim 13, wherein the inorganic layer comprises silicon nitride.

16. The display apparatus of claim 13, wherein at least a part of the buffer layer directly contacts the encapsulation layer.

17. The display apparatus of claim 13, wherein the scattering particles are configured to scatter incident light, and are either not located in the non-scattering areas, or are located in the non-scattering areas at a lower concentration than in the scattering areas.

18. The display apparatus of claim 13, wherein the light-shielding layer comprises a light absorbing material.

\* \* \* \* \*